US012598818B2

(12) United States Patent
Chen et al.

(10) Patent No.: US 12,598,818 B2
(45) Date of Patent: Apr. 7, 2026

(54) DOPED REGION STRUCTURE AND SOLAR CELL COMPRISING THE SAME, CELL ASSEMBLY, AND PHOTOVOLTAIC SYSTEM

(71) Applicant: ZHEJIANG AIKO SOLAR ENERGY TECHNOLOGY CO., LTD., Jinhua (CN)

(72) Inventors: Gang Chen, Yiwu (CN); Kaifu Qiu, Yiwu (CN); Yongqian Wang, Yiwu (CN); Xinqiang Yang, Yiwu (CN)

(73) Assignee: ZHEJIANG AIKO SOLAR ENERGY TECHNOLOGY CO., LTD., Jinhua (CN)

( * ) Notice: Subject to any disclaimer, the term of this patent is extended or adjusted under 35 U.S.C. 154(b) by 0 days.

(21) Appl. No.: 18/206,652

(22) Filed: Jun. 7, 2023

(65) Prior Publication Data

US 2023/0317866 A1 Oct. 5, 2023

Related U.S. Application Data

(63) Continuation-in-part of application No. 17/509,049, filed on Oct. 24, 2021, now Pat. No. 11,749,761.

(30) Foreign Application Priority Data

Jul. 22, 2021 (CN) ........................ 202110828468.X

(51) Int. Cl.
  *H10F 77/30* (2025.01)
  *H10F 10/16* (2025.01)
  (Continued)

(52) U.S. Cl.
  CPC ......... *H10F 10/16* (2025.01); *H10F 77/1642* (2025.01); *H10F 77/1662* (2025.01); *H10F 77/311* (2025.01); *H10F 77/707* (2025.01)

(58) Field of Classification Search
  CPC ........... H01L 31/02167; H01L 31/0682; H01L 31/0745; H01L 31/1868; H10F 10/13; (Continued)

(56) References Cited

U.S. PATENT DOCUMENTS 9,059,341 B1 6/2015 Scardera et al.
11,489,080 B1 11/2022 Chen et al.
(Continued)

FOREIGN PATENT DOCUMENTS

CN 103531653 A 1/2014
CN 106531816 A 3/2017
(Continued)

OTHER PUBLICATIONS

Machine translation of CN-112635592-A, Tong, H. Retrieved from https://worldwide.espacenet.com/publicationDetails/biblio?CC=CN&NR=112635592A&KC=A&FT=D&ND=3&date=20210409&DB=&locale=en_EP (Year: 2021).*
(Continued)

*Primary Examiner* — Mayla Gonzalez Ramos
(74) *Attorney, Agent, or Firm* — ANOVA LAW GROUP, PLLC

(57) ABSTRACT

The disclosure relates to the technical field of solar cells, and provides a solar cell and a doped region structure thereof, a cell assembly, and a photovoltaic system. The doped region structure includes a first doped layer, a passivation layer, and a second doped layer that are disposed on a silicon substrate in sequence. The passivation layer is a porous structure having the first doped layer and/or the second doped layer inlaid in a hole region. The first doped layer and the second doped layer have a same doping polarity. By means of the doped region structure of the solar cell provided in the disclosure, the difficulty in production and the limitation on conversion efficiency as a result of precise requirements for
(Continued)

the accuracy of a thickness of a conventional tunneling layer are resolved.

18 Claims, 5 Drawing Sheets

(51) Int. Cl.

| | |
|---|---|
| *H10F 77/164* | (2025.01) |
| *H10F 77/166* | (2025.01) |
| *H10F 77/70* | (2025.01) |

(58) Field of Classification Search

CPC ...... H10F 10/146; H10F 10/16; H10F 77/707; H10F 77/1642; H10F 77/1662; H10F 77/311

See application file for complete search history.

(56) References Cited

U.S. PATENT DOCUMENTS

| | | | |
|---|---|---|---|
| 2010/0206369 A1 * | 8/2010 | Kim | H01L 31/022441 |
| | | | 257/E31.037 |
| 2010/0236613 A1 * | 9/2010 | Lee | H01L 31/0735 |
| | | | 257/E21.24 |
| 2012/0145233 A1 | 6/2012 | Syn et al. | |
| 2013/0269777 A1 | 10/2013 | Jin et al. | |
| 2015/0280029 A1 | 10/2015 | Harley et al. | |
| 2016/0329440 A1 * | 11/2016 | Turner | H01L 31/02167 |
| 2016/0336468 A1 * | 11/2016 | Chung | H01L 31/02168 |
| 2016/0343885 A1 | 11/2016 | Nasuno et al. | |
| 2018/0122963 A1 | 5/2018 | Xu et al. | |
| 2022/0029040 A1 * | 1/2022 | Yin | H01L 31/022425 |

FOREIGN PATENT DOCUMENTS

| | | | | |
|---|---|---|---|---|
| CN | 206907778 U | | 1/2018 | |
| CN | 108336154 A | | 7/2018 | |
| CN | 109087956 A | * | 12/2018 | H01L 31/02167 |
| CN | 209389043 U | | 9/2019 | |
| CN | 112201701 A | | 1/2021 | |
| CN | 112490324 A | | 3/2021 | |
| CN | 112599616 A | | 4/2021 | |
| CN | 112599617 A | | 4/2021 | |
| CN | 112635591 A | | 4/2021 | |
| CN | 112635592 A | * | 4/2021 | H01L 31/0288 |
| EP | 3579284 A1 | | 12/2019 | |
| EP | 4123724 B1 | | 10/2023 | |
| EP | 4374430 B1 | | 8/2025 | |
| JP | 2012119537 A | | 6/2012 | |
| JP | 2015201666 A | | 11/2015 | |
| JP | 2018050032 A | | 3/2018 | |
| JP | 2018092982 A | | 6/2018 | |
| JP | 2018093168 A | | 6/2018 | |
| JP | 2021061395 A | | 4/2021 | |
| KR | 20100119293 A | | 11/2010 | |
| WO | 2013062741 A1 | | 5/2013 | |

OTHER PUBLICATIONS

Machine translation of CN-109087956-A, Chen J. (Year: 2018).*

C. Hollemann et al., Separating the two polarities of the POLO contacts of an 26.1%-efficient IBC solar cell, Scientific Reports, 2020, pp. 1-14, vol. 10, Issue No. 658.

Jan Krugener et al., Improvement of the SRH bulk lifetime upon formation of n-type POLO junctions for 25% efficient Si solar cells, Solar Energy Materials and Solar Cells, 2017, pp. 85-91, vol. 173.

Felix Haase et al., Transferring the Record p-type Si POLO-IBC Cell Technology Towards an Industrial Level, 2019 IEEE 46th Photovoltaic Specialists Conference (PVSC), 2019, pp. 2200-2206, Chicago, USA.

Office Action of counterpart Japanese Patent Application No. 2022-097101 issued on Sep. 13, 2022.

Office Action of counterpart Chinese Patent Application No. 202110828468.X issued on Aug. 31, 2021.

Hollemann C et al: "Separating the two polarities of the POLO contacts of an 26.1%-efficient IBC solar cell", Scientific Reports , vol. 10, No. 1, p. 658, Dec. 1, 2017 (Dec. 1, 2017).

Intellectual Property Office of the Philippines Subsequent Substantive Examination Report For Application No. 1/2022/551812 May 30, 2025 9 Pages.

Folchert N. et al: "Temperature-dependent contact resistance of carrier selective Poly-Si on oxide junctions", Solar Energy Materials and Solar Cells, vol. 185, Oct. 1, 2018 (Oct. 1, 2018), pp. 425-430, XP055912978.

Bayerl Paul et al: "Contacting a single nanometer-sized pinhole in the interfacial oxide of a poly-silicon on oxide (POLO) solar cell junction", Progress in Photovoltaics: Research and Applications, vol. 29, No. 8, Mar. 30, 2021 (Mar. 30, 2021), pp. 936-942, XP055912980.

Feldmann Frank et al: "A Study on the Charge Carrier Transport of Passivating Contacts", IEEE Journal of Photovoltaics, vol. 8, No. 6, Nov. 1, 2018 (Nov. 1, 2018), pp. 1503-1509, XP011703404.

Kale Abhijit S et al: "Understanding the charge transport mechanisms through ultrathin SiOxlayers in passivated contacts for high-efficiency silicon solar cells", Applied Physics Letters, vol. 114, No. 8, Feb. 27, 2019 (Feb. 27, 2019), XP012235799.

The European Patent Office (EPO) The Extended European Search Report for 25190197.1 Nov. 18, 2025 13 Pages.

* cited by examiner

DOPED REGION STRUCTURE AND SOLAR CELL COMPRISING THE SAME, CELL ASSEMBLY, AND PHOTOVOLTAIC SYSTEM

CROSS-REFERENCE TO RELATED APPLICATIONS

This application is a continuation-in-part of U.S. application Ser. No. 17/509,049 filed Oct. 24, 2021, and claims the benefit of Chinese Patent Application No. 202110828468.X filed Jul. 22, 2021. The contents of all of the aforementioned applications, including any intervening amendments thereto, are incorporated herein by reference.

BACKGROUND

The disclosure relates to the technical field of solar cells, and in particular, to a doped region structure and a solar cell comprising the same, a cell assembly, and a photovoltaic system.

Electricity generated by solar cells is a sustainable clean energy source. By virtue of a photovoltaic effect of a semiconductor p-n junction, sunlight can be converted into electric energy. Conversion efficiency is an important indicator of the performance of solar cells. In an interdigitated back contact (IBC) cell, a positive/negative electrode is designed on a back side of the cell, so that a front surface is not at all shielded by a metal gate line, thereby completely eradicating an optical loss caused by the shielding of the metal gate line. In addition, a width of the electrode may be designed wider than a conventional electrode, so that a series resistance loss is reduced, thereby significantly improving the conversion efficiency. In addition, since the front side is designed with no electrodes, the product is more esthetically pleasing and has many applications.

In a conventional passivated IBC cell with doped polysilicon, the doped polysilicon is isolated from a silicon substrate by a tunneling layer, forming a passivated contact structure in a stacked form of doped polysilicon-tunneling layer (an insulation layer)-silicon substrate. A thickness of the tunneling layer has a very large impact on a tunneling resistance. In order to form a desirable resistivity, the thickness of the tunneling layer is required to be small enough. However, in order to realize a desirable passivation effect, the thickness of the tunneling layer is required to be large enough. Therefore, the thickness range of the tunneling layer is required to be strictly controlled. During production, the accuracy of the thickness of the tunneling layer is difficult to control. Therefore, at present, production cannot be scaled up. In addition, requirements are also imposed for a thermal process in a follow-up production process. Therefore, the conversion efficiency of the cell is limited.

SUMMARY

Embodiments of the disclosure are intended to provide a doped region structure of a solar cell, to resolve the difficulty in production and the limitation on conversion efficiency as a result of precise requirements for a thickness of a conventional tunneling layer.

The embodiments of the disclosure are implemented as follows. A doped region structure of a solar cell includes:

a first doped layer, a passivation layer, and a second doped layer that are disposed on a silicon substrate in sequence;

the passivation layer is a porous structure comprising a hole region, and the first doped layer and/or the second doped layer are disposed in the hole region.

Further, the first doped layer and the second doped layer have a same doping polarity.

Further, a pore size of the porous structure is less than 20 μm.

Further, the pore size of the porous structure is less than 10 μm.

Further, the pore size of the porous structure is less than 1000 nm. A hole is designed as a nano-level hole having a pore size less than 1000 nm, and a surface hole density may be designed up to $10^6$-$10^8$/cm$^2$. It may be understood that the arrangement of nano-level hole having the pore size less than 1000 nm greatly reduces the overall contact area between the second doped layer and the silicon substrate, thereby not only reducing the resistance, but also greatly reducing the recombination.

Further, a non-hole region of the porous structure includes a dopant having a same doping type as the first doped layer and/or the second doped layer.

Further, a part of the hole region of the porous structure includes the first doped layer and/or the second doped layer.

Further, a ratio of an area of the hole region of the porous structure to an entire area of the porous structure is less than 20%.

Further, a thickness of the passivation layer is in a range of 0.5-10 nm.

Further, the thickness of the passivation layer is in a range of 0.8-2 nm.

Further, the passivation layer is an oxide layer, a silicon carbide layer, an amorphous silicon layer, or a combination thereof.

Further, the oxide layer comprises a silicon oxide layer, an aluminum oxide layer, or a combination thereof.

Further, the silicon carbide layer in the passivation layer includes a hydrogenated silicon carbide layer.

Further, a doping concentration of the first doped layer is between a doping concentration of the silicon substrate and a doping concentration of the second doped layer.

Further, a junction depth of the first doped layer is less than 1.5 μm.

Further, the first doped layer is a monocrystalline silicon doped layer doped with a group-III or group-V element.

Further, the second doped layer includes a polysilicon doped layer, a silicon carbide doped layer, or an amorphous silicon doped layer.

Further, the silicon carbide doped layer in the second doped layer comprises at least one silicon carbide doped film.

Further, the refractive indexes of the silicon carbide doped films decrease from the silicon substrate toward outside.

Further, the silicon carbide doped layer in the second doped layer includes a hydrogenated silicon carbide doped layer, a conductivity of the hydrogenated silicon carbide doped layer is greater than 0.01 S·cm, and a thickness of the hydrogenated silicon carbide doped layer is greater than 10 nm.

Another embodiment of the disclosure is intended to provide a solar cell. The solar cell includes:

a silicon substrate;

a first doped region and a second doped region, alternately disposed on a back side of the silicon substrate and having opposite polarities;

a first dielectric layer, disposed on a front side of the silicon substrate;

a second dielectric layer, disposed between the first doped region and the second doped region; and a first conductive layer and a second conductive layer, respectively disposed in the first doped region and the second doped region.

The first doped region and/or the second doped region use(s) the doped region structure described above.

Further, one of the first doped region and the second doped region uses the doped region structure described above, and the other of the first doped region and the second doped region is a third doped layer disposed on the back side of the silicon substrate.

Further, the third doped layer is a monocrystalline silicon doped layer doped with a group-III or group-V element.

Further, grooves spaced apart are provided on the back side of the silicon substrate, and the first doped region and the second doped region are alternately disposed in the grooves.

Further, grooves spaced apart are provided on the back side of the silicon substrate, one of the first doped region and the second doped region is disposed in one of the grooves, and the other of the first doped region and the second doped region is disposed outside the groove.

Further, a trench is provided between the first doped region and the second doped region.

Further, the first doped region and/or the second doped region are/is disposed in a part of regions inside and outside the groove.

Further, the first dielectric layer and the second dielectric layer each are an aluminum oxide layer, a silicon nitride layer, a silicon oxynitride layer, a silicon carbide layer, an amorphous silicon layer, a silicon oxide layer, or a combination thereof.

Further, the first dielectric layer and/or the second dielectric layer include(s) the aluminum oxide layer and the silicon carbide layer, or the silicon oxide layer and silicon carbide layer; and a thickness of the first dielectric layer is greater than 50 nm, and a thickness of the second dielectric layer is greater than 25 nm.

Further, a thickness of the aluminum oxide layer or the silicon oxide layer in the first dielectric layer is less than 40 nm, a thickness of the aluminum oxide layer or the silicon oxide layer in the second dielectric layer is less than 25 nm, and a thickness of the silicon carbide layer in the first dielectric layer and/or in the second dielectric layer is greater than 10 nm.

Further, the silicon carbide layer in the first dielectric layer and/or in the second dielectric layer comprises at least one silicon carbide film.

Further, the refractive indexes of the silicon carbide films decrease from the silicon substrate toward outside.

Further, a magnesium fluoride layer is further disposed outside the first dielectric layer and/or the second dielectric layer.

Further, the first conductive layer and the second conductive layer are TCO transparent conductive films and/or metal electrodes.

Further, the metal electrodes each include a silver electrode, a copper electrode, an aluminum electrode, a tin-coated copper electrode, or a silver-coated copper electrode.

Further, the copper electrode is electroplated copper prepared by using an electroplating process or the copper electrode prepared by means of physical vapor deposition.

Further, an electric field layer or a floating junction is disposed between the front side of the silicon substrate and the first dielectric layer.

Further, one of the first doped region and the second doped region is a P-type doped region, the other of the first doped region and the second doped region is an N-type doped region, and a thickness of a passivation layer in the P-type doped region is greater than a thickness of a passivation layer in the N-type doped region.

Further, one of the first doped region and the second doped region is a P-type doped region, the other of the first doped region and the second doped region is an N-type doped region, and a hole density of a passivation layer in the P-type doped region is greater than a hole density of a passivation layer in the N-type doped region.

Another embodiment of the disclosure is intended to provide a solar cell. The solar cell includes:

a silicon substrate;

the doped region structure described above, disposed on a back side of the silicon substrate;

a third dielectric layer, disposed on the doped region structure;

a fourth doped layer and a fourth dielectric layer, disposed on a front side of the silicon substrate in sequence; and a third conductive layer and a fourth conductive layer, respectively electrically connected to the doped region structure and the fourth doped layer.

The doped region structure and the fourth doped layer have opposite polarities.

Another embodiment of the disclosure is intended to provide a cell assembly. The cell assembly includes one of the solar cells described above.

Another embodiment of the disclosure is intended to provide a photovoltaic system. The photovoltaic system includes the cell assembly described above.

Another embodiment of the disclosure is intended to provide a cell assembly. The cell assembly includes another of the solar cells described above.

Another embodiment of the disclosure is intended to provide a photovoltaic system. The photovoltaic system includes another of the cell assemblies described above.

Different from the passivated contact structure in the prior art, according to the doped region structure of the solar cell provided in the embodiments of the disclosure, the first doped layer, the passivation layer, and the second doped layer are disposed in sequence, the passivation layer is arranged as a porous structure, and the hole region has the first doped layer and/or the second doped layer. Therefore, a conductive channel is formed in the hole region of the passivation layer, so that a desirable resistivity of the passivation layer is formed. In this way, a thickness of the passivation layer has a less impact on the resistance, and the control requirements for the thickness of the passivation layer are lowered. Thus, more methods are applicable to preparation of the passivation layer compared with the prior art. In an embodiment, the hole is designed as a nano-level hole having a pore size less than 1000 nm, so that the surface hole density is as high as $10^6$-$10^8$/cm$^2$. It may be understood that the arrangement of nano-level hole having the pore size less than 1000 nm greatly reduces the overall contact area between the second doped layer and the silicon substrate, thereby not only reducing the resistance, but also greatly reducing the recombination. The first doped layer is disposed between the silicon substrate and the passivation layer to form a separation electric field capable of enhancing surface electron holes, so that the field passivation effect is enhanced. Since a Fermi level of the first doped layer is different from a Fermi level of the silicon substrate, the Fermi level of the first doped layer is changed. A solid concentration of impurities (transition metals) is increased, so that an additional impurity gettering effect is achieved. In addition, in the porous structure, the second doped layer is connected to the silicon substrate through the doped hole region and the first doped layer, so that the overall resistance of the prepared cell is further reduced, and the conversion efficiency of the cell is improved. In this way, the difficulty in production and the limitation on the conversion efficiency as a result of precise requirements for the thickness of the conventional tunneling layer are resolved.

DETAILED DESCRIPTION

To make the objectives, technical solutions and advantages of the disclosure clearer and more comprehensible, the disclosure is further described in detail below with reference to the accompanying drawings and embodiments. It is to be understood that the specific embodiments described herein are merely used to explain the disclosure, but are not intended to limit the disclosure.

In the disclosure, unless otherwise explicitly specified or defined, the terms such as "mount", "install", "connect", "connection", and "fix" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand specific meanings of the foregoing terms in the disclosure according to specific situations. The term "and/or" used in this specification includes any and all combinations of one or more related listed items.

Different from the passivated contact structure in the prior art, in the disclosure, a first doped layer, a passivation layer, and a second doped layer are disposed in sequence, the passivation layer is arranged as a porous structure, and a hole region has the first doped layer and/or the second doped layer. Therefore, a conductive channel is formed in the hole region of the passivation layer, so that a desirable resistivity of the passivation layer is formed. In this way, a thickness of the passivation layer has a less impact on the resistance, and the control requirements for the thickness of the passivation layer are lowered. Thus, more methods are applicable to preparation of the passivation layer compared with the prior art. The first doped layer is disposed between the silicon substrate and the passivation layer to form a separation electric field capable of enhancing surface electron holes, so that the field passivation effect is enhanced. Since a Fermi level of the first doped layer is different from a Fermi level of the silicon substrate, the Fermi level of the first doped layer is changed. A solid concentration of impurities (transition metals) is increased, so that an additional impurity gettering effect is achieved. In addition, in the porous structure, the second doped layer is connected to the silicon substrate through the doped hole region and the first doped layer, so that the overall resistance of the prepared cell is further reduced, and the conversion efficiency of the cell is improved. In this way, the difficulty in production and the limitation on the conversion efficiency as a result of precise requirements for the thickness of the conventional tunneling layer are resolved.

Example 1

Figure 1:
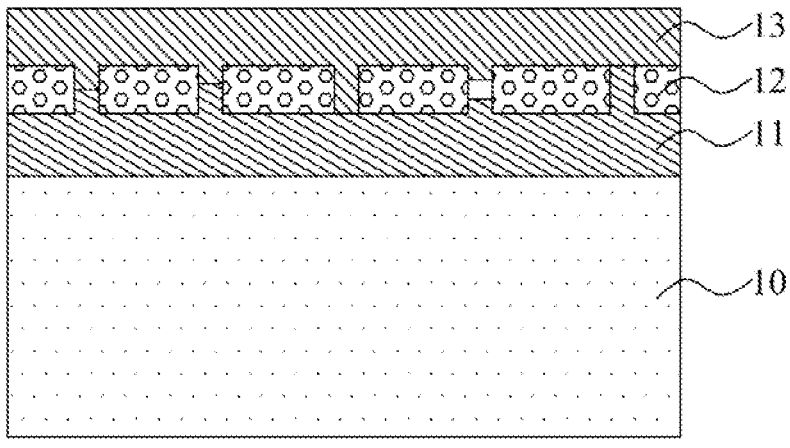
FIG. 1 is a schematic structural diagram of a doped region structure of a solar cell according to an embodiment of the disclosure.

An embodiment of the disclosure provides a doped region structure of a solar cell. For ease of description, only parts related to this embodiment of the disclosure are shown. Referring to FIG. 1, the doped region structure of the solar cell provided in this embodiment of the disclosure includes:

a first doped layer 11, a passivation layer 12, and a second doped layer 13 that are disposed on a silicon substrate 10 in sequence.

The passivation layer 12 is a porous structure having the first doped layer 11 and/or the second doped layer 13 in a hole region.

In an embodiment of the disclosure, the silicon substrate 10 has a front side facing the sun during normal operation and a back side opposite to the front side. The front side is a light-receiving surface. The back side is opposite to the front side and disposed on another side of the silicon substrate 10. That is to say, the front side and the back side are located on different and opposite sides of the silicon substrate 10. In this embodiment, the silicon substrate 10 is an N-type monocrystalline silicon wafer. It may be understood that, in other embodiments, the silicon substrate 10 may also be silicon wafers of other types, such as a poly-silicon wafer, a quasi-monocrystalline silicon wafer, or the like. The silicon substrate 10 may also be designed as a P type. The silicon substrate 10 may be designed according to actual use requirements, which is not specifically limited herein.

In an embodiment of the disclosure, the passivation layer 12 is preferably an oxide layer, a silicon carbide layer, an amorphous silicon layer, or a combination thereof. In some examples of the disclosure, the passivation layer 12 may include a single material such as an oxide layer, a plurality of types of materials such as a combination of an oxide layer and an amorphous silicon layer, or a single material such as a combination of a plurality of amorphous silicon layers each having a specific refractive index. In addition, the first passivation layer 12 may also be a silicon oxynitride layer, a silicon nitride layer, or the like. It may be understood that the specific structure of the passivation layer 12 includes but is not limited to the above. The passivation layer 12 may be correspondingly designed according to actual use requirements, which is not specifically limited herein. Further, a thickness of the passivation layer 12 is in a range of 0.5-10 nm. In a preferable embodiment of the disclosure, the thickness of the passivation layer 12 is in a range of 0.8-2 nm. The thickness of the passivation layer 12 may be designed as a thickness of a tunneling layer in the prior art or a thickness larger than the thickness of the conventional tunneling layer. The thickness may be designed according to actual use requirements, which is not specifically limited herein.

In a preferable embodiment of the disclosure, specifically, the passivation layer 12 includes the oxide layer and the silicon carbide layer. The oxide layer and the silicon carbide layer are arranged in sequence from the silicon substrate 10 toward outside. The oxide layer is in contact with the first doped layer 11 located inside, and the silicon carbide layer is in contact with the second doped layer 13 located outside.

Further, the oxide layer preferably comprises a silicon oxide layer, an aluminum oxide layer, or a combination thereof. Therefore, the passivation layer 12 may also be a combination of the silicon oxide layer and the aluminum oxide layer in the oxide layer. The silicon carbide layer in the passivation layer 12 includes a hydrogenated silicon carbide layer. Hydrogen in the hydrogenated silicon carbide layer enters the silicon substrate 10 under a diffusion mechanism and a thermal effect, so that a dangling bond for neutralizing the back side of the silicon substrate 10 passivates defects of the silicon substrate 10. Therefore, mitigating dangling bonds in a forbidden band increases the probability that a carrier enters the second doped layer 13 through the passivation layer 12.

Further, in an embodiment of the disclosure, the passivation layer 12 is a porous structure. The porous structure may be prepared by means of additional chemical corrosion, dry etching, or thermal diffusion impact, or the like. The porous structure is performed according to actual use requirements, which is not specifically limited herein. It should be noted that, the porous structure is in a top view of the passivation layer 12. In a cross-sectional view of the passivation layer 12, a multi-channel structure is shown. The porous structure has holes extending through the passivation layer 12. The porous structure also has holes not extending through the passivation layer 12, forming grooves/openings on a surface of the passivation layer 12. A pore size of the porous structure is less than 20 μm. Specifically, an average pore size of the holes is less than 20 μm, or pore sizes of 90% of all of the holes are less than 20 μm. Further, the pore size of the porous structure is less than 10 μm. Further, the pore size of the porous structure is less than 1000 nm. In this case, a hole is designed as a nano-level hole having a pore size less than 1000 nm, and a surface hole density may be designed up to $10^6$-$10^8$/cm$^2$. It may be understood that the arrangement of nano-level hole having the pore size less than 1000 nm greatly reduces the overall contact area between the second doped layer and the silicon substrate, thereby not only reducing the resistance, but also greatly reducing the recombination. A ratio of an area of the hole region of the porous structure to an entire area of the porous structure is less than 20%, that is, the holes are sparsely distributed on the passivation layer 12.

In an embodiment of the disclosure, the hole region of the porous structure includes the first doped layer 11 and/or the second doped layer 13. That is to say, the hole region may be inlaid with the first doped layer 11 or the second doped layer 13 alone, or may be inlaid with a mixture of the first doped layer 11 and the second doped layer 13. It needs to be noted that, in an actual production and preparation process, a part of the hole region of the porous structure may include the first doped layer 11 and/or the second doped layer 13, and other parts that are not filled with the first doped layer 11 and/or the second doped layer 13 are gap regions. It needs to be further noted that, in addition to the first doped layer 11 and/or the second doped layer 13 filled in the hole region, impurities (such as hydrogen, oxygen, and various metal elements) formed in a thermal process (the production of solar cells may include a plurality of high temperature processes according to different processes) or generated during segregation are allowed to exist in the hole region.

Further, in an embodiment of the disclosure, a non-hole region of the porous structure includes a dopant having a same doping type as the first doped layer 11 and/or the second doped layer 13. For example, when the first doped layer 11 and the second doped layer 13 are N-type doped layers (such as a phosphorus doped layer), the non-hole region of the passivation layer 12 includes a diffused N-type dopant.

In an embodiment of the disclosure, the first doped layer 11 is located between the silicon substrate 10 and the passivation layer 12. The first doped layer 11 may be a doped layer directly formed on the silicon substrate 10 by means of ion implantation or the like. In this case, the first doped layer 11 is located on the silicon substrate 10. Correspondingly, the passivation layer 12 is prepared on the first doped layer 11. The first doped layer 11 may also be a doped layer formed on the silicon substrate 10 after a doping source directly penetrates the passivation layer 12 or the holes in the porous structure during preparation of the second doped layer 13. In this case, the first doped layer 11 is located in the silicon substrate 10. Correspondingly, the passivation layer 12 is directly prepared on the silicon substrate 10. Therefore, during the preparation of the second doped layer 13, the passivation layer is thermally diffused into the silicon substrate 10, so that a part of the silicon substrate 10 is transformed into the first doped layer 11 through diffusion. A doping concentration of the first doped layer 11 is between a doping concentration of the silicon substrate 10 and a doping concentration of the second doped layer 13. In a preferred embodiment of the disclosure, the first doped layer 11 and the second doped layer 13 have a same doping polarity. For example, when the second doped layer 13 is an N-type doped layer, the first doped layer 11 is correspondingly preferably an N-type doped layer. It needs to be noted that, the doping polarities of the first doped layer 11 and the second doped layer 13 may be different from a doping polarity of the silicon substrate 10. For example, in this embodiment, the silicon substrate 10 is an N-type monocrystalline silicon, and the first doped layer 11 and the second doped layer 13 may be P-type doped layers.

Preferably, a material of the first doped layer 11 is preferably designed the same as the silicon substrate 10. That is to say, when the silicon substrate 10 is a monocrystalline silicon wafer, the first doped layer 11 is also preferably designed as the monocrystalline silicon wafer. The first doped layer 11 is a monocrystalline silicon doped layer doped with a group-III or group-V element. When the second doped layer 13 is the N-type doped layer, the first doped layer 11 is a monocrystalline silicon doped layer doped with group-V elements such as nitrogen, phosphorus, and arsenic. When the second doped layer 13 is the P-type doped layer, the first doped layer 11 is a monocrystalline silicon doped layer doped with group-III elements such as boron, aluminum, and gallium. It may be understood that, when the silicon substrate 10 is designed as silicon wafers of other types, the first doped layer 11 may also be correspondingly designed as doped silicon wafers of other types doped with a group-III or group-V element.

Further, in an embodiment of the disclosure, the first doped layer 11 is in a discrete or continuous distribution. The first doped layer may be completely continuously disposed between the silicon substrate 10 and the passivation layer 12, or locally discretely distributed near each hole region of the passivation layer 12. The distribution of the first doped layer 11 may be controlled by using a doping process. A doping amount increases over a doping time, so that the first doped layer 11 is more continuous, until the first doped layer 11 fully covering the silicon substrate 10 is formed thereon. Further, a junction depth of the first doped layer 11 is less than 1.5 μm.

In an embodiment of the disclosure, the second doped layer 13 includes a polysilicon doped layer, a silicon carbide doped layer, or an amorphous silicon doped layer. The silicon carbide doped layer in the second doped layer 13 comprises at least one silicon carbide doped film each having a specific refractive index. The refractive indexes of the silicon carbide doped films decrease from the silicon substrate 10 toward the outside. It needs to be noted that, thicknesses and the refractive indexes of the silicon carbide doped films may be designed according to actual use requirements, provided that the refractive indexes decrease from the silicon substrate 10 toward the outside, which are not specifically limited herein. Since silicon carbide has a wide optical band gap and a low absorption coefficient, parasitic absorption can be reduced, and a short-circuit current density can be effectively increased. Further, the silicon carbide doped layer in the second doped layer 13 includes a hydrogenated silicon carbide doped layer. A conductivity of the hydrogenated silicon carbide doped layer is greater than 0.01 S·cm, and a thickness of the hydrogenated silicon carbide doped layer is greater than 10 nm. Correspondingly, the conductivity and the thickness may also be set to other values, provided that a requirement for the of the second doped layer 13 can be met by controlling the conductivity and the thickness of the hydrogenated silicon carbide doped layer, which are not specifically limited herein. It needs to be noted that, the first doped layer 11 and the second doped layer 13 may have a same material or different materials. For example, the first doped layer 11 and the second doped layer 13 both include doped polysilicon. Alternatively, the first doped layer 11 may include doped monocrystalline silicon, and the second doped layer 13 may include doped silicon carbide.

Different from the passivated contact structure in the prior art, in this embodiment, the first doped layer, the passivation layer, and the second doped layer are disposed in sequence, the passivation layer is arranged as a porous structure, and the hole region has the first doped layer and/or the second doped layer. Therefore, a conductive channel is formed in the hole region of the passivation layer, so that a desirable resistivity of the passivation layer is formed. In this way, a thickness of the passivation layer has a less impact on the resistance, and the control requirements for the thickness of the passivation layer are lowered. Thus, more methods are applicable to preparation of the passivation layer compared with the prior art. The first doped layer is disposed between the silicon substrate and the passivation layer to form a separation electric field capable of enhancing surface electron holes, so that the field passivation effect is enhanced. Since a Fermi level of the first doped layer is different from a Fermi level of the silicon substrate, the Fermi level of the first doped layer is changed. A solid concentration of impurities (transition metals) is increased, so that an additional impurity absorption effect is achieved. In addition, in the porous structure, the second doped layer is connected to the silicon substrate through the doped hole region and the first doped layer, so that the overall resistance of the prepared cell is further reduced, and the conversion efficiency of the cell is improved. In this way, the difficulty in production and the limitation on the conversion efficiency as a result of precise requirements for the thickness of the conventional tunneling layer are resolved.

Example 2

A second embodiment of the disclosure provides a solar cell. For ease of description, only parts related to this embodiment of the disclosure are shown. Referring to FIG. 2 to FIG. 8, the solar cell provided in this embodiment of the disclosure includes:

a silicon substrate 10;

a first doped region 20 and a second doped region 30, alternately disposed on a back side of the silicon substrate 10 and having opposite polarities;

a first dielectric layer 40, disposed on a front side of the silicon substrate 10;

a second dielectric layer 50, disposed between the first doped region 20 and the second doped region 30; and a first conductive layer 60 and a second conductive layer 70, respectively disposed in the first doped region 20 and the second doped region 30.

The first doped region 20 and/or the second doped region 30 use(s) the doped region structure described in the above embodiments.

Figure 2:
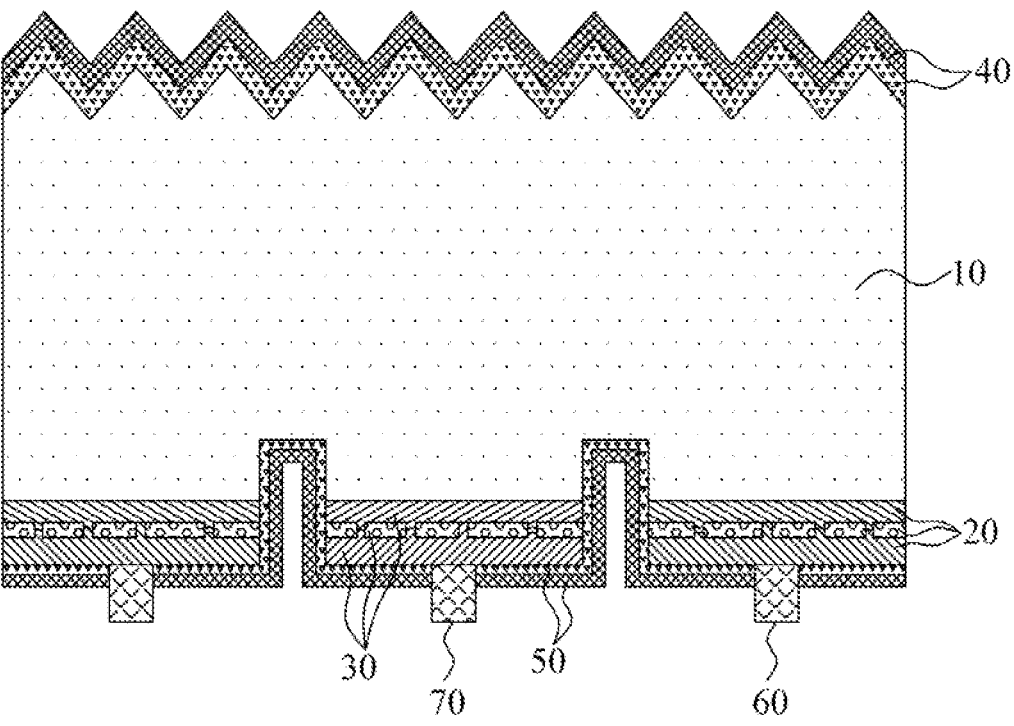
FIG. 2 to FIG. 8 are schematic structural diagrams of a solar cell during various implementation according to an embodiment of the disclosure.
Figure 4:
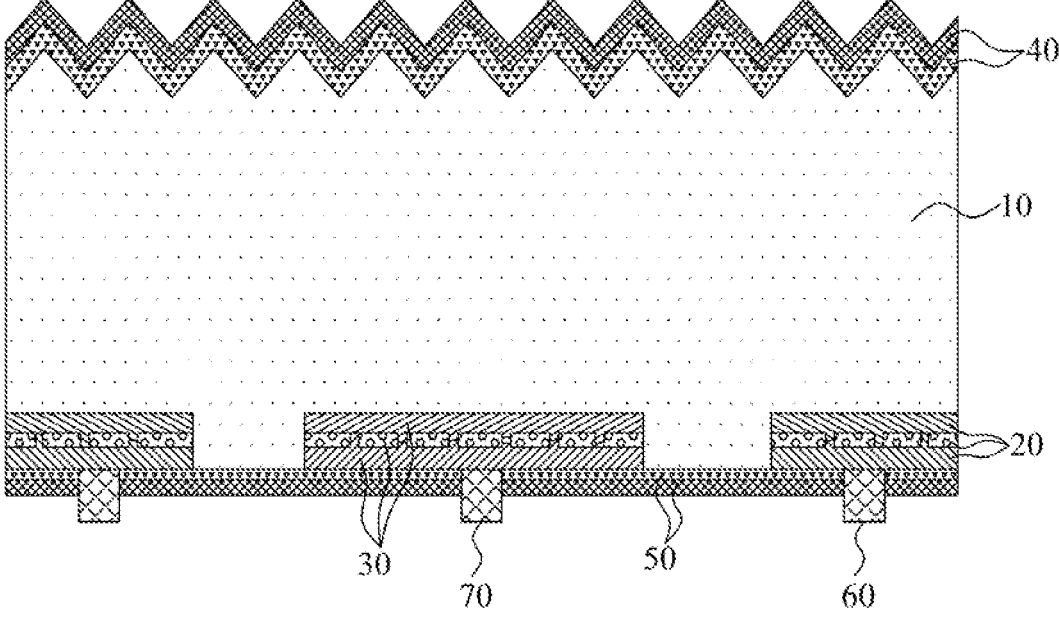
Figure 6:
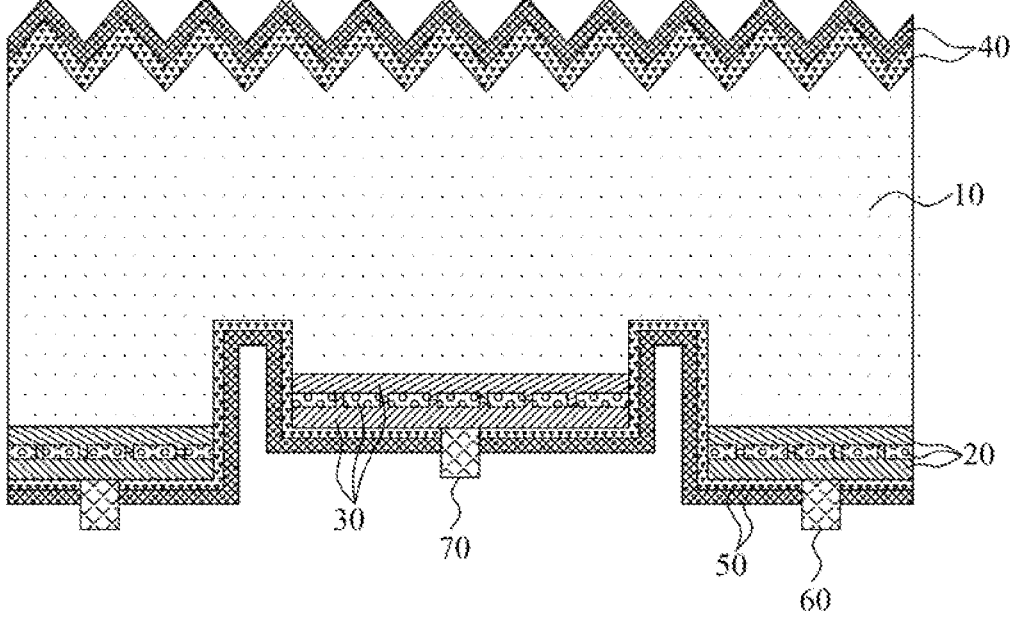

Thus, in an embodiment of the disclosure, the first doped region 20 and the second doped region 30 in the solar cell both may use the doped region structure described in the above embodiments. Referring to FIG. 2, FIG. 4, and FIG. 6, since the first doped region 20 and the second doped region 30 have opposite polarities, a first doped layer and a second doped layer in the first doped region 20 and a first doped layer and a second doped layer in the second doped region 30 also have opposite polarities. For example, when the first doped layer and the second doped layer in the first doped region 20 are P-type doped layers, the first doped layer and the second doped layer in the second doped region 30 are N-type doped layers having opposite doping polarities. In this case, the first doped region 20 is a P-type doped region, and the second doped region 30 is an N-type doped region. Definitely, the first doped region 20 may also be the N-type doped region, and the second doped region 30 may also be the P-type doped region. Therefore, when one of the first doped region 20 and the second doped region 30 is the P-type doped region, the other of the first doped region and the second doped region is the N-type doped region.

Definitely, alternatively, one of the first doped region 20 and the second doped region 30 in the solar cell uses the doped region structure described in the above embodiments, and the other of the first doped region and the second doped region uses a conventional structure (such as a passivated contact structure or a diffusion structure). In this embodiment, preferably, the other one is a third doped layer disposed in the back side of the silicon substrate 10. That is to say, the other one uses the conventional diffusion structure, as shown in FIG. 3, FIG. 5, FIG. 7, and FIG. 8. Optionally, the other one may also use the conventional passivated contact structure. The passivated contact structure includes a tunneling layer and a doped region (not shown in the figure). It needs to be noted that, the third doped layer is also a monocrystalline silicon doped layer doped with a group-III or group-V element. For a specific structure of the third doped layer, refer to the description of the first doped layer in the above embodiments. It needs to be further noted that, since the first doped region 20 and the second doped region 30 have opposite polarities, and the first doped layer and the second doped layer have the same doping polarity, the first doped layer and the third doped layer are respectively doped with an element of a different group. That is to say, when the first doped layer is doped with a group-III element, the third doped layer is doped with a group-V element. When the first doped layer is doped with a group-V element, the third doped layer is doped with a group-III element.

When the first doped region 20 and the second doped region 30 both use the doped region structure described in the above embodiments, a material and a thickness selected for each layer structure in the first doped region 20 may be same as or different from those selected for each layer structure in the second doped region 30. For example, when a passivation layer in the first doped region 20 is specifically selected as a silicon oxide layer and a silicon carbide layer, a passivation layer in the second doped region 30 may be selected to be the same as the passivation layer in the first doped region 20, or may be selected as a material different from the passivation layer in the first doped region 20, such as an aluminum oxide layer and a silicon carbide layer.

A thickness of the passivation layer in the first doped region 20 may be designed same as or different from a thickness of the passivation layer in the second doped region 30. Preferably, regardless of whether the material of the passivation layer in the first doped region 20 is the same as the material of the passivation layer in the second doped region 30, the thickness of the passivation layer corresponding to the first doped layer doped with the group-III element is designed to be larger, and the thickness of the passivation layer corresponding to the first doped layer doped with the group-V element is designed to be smaller. That is to say, the thickness of the passivation layer in the P-type doped region is greater than the thickness of the passivation layer in the N-type doped region. A main reason lies in that the P-type doped region requires a process such as boron doping and a higher temperature, and requires a thicker passivation layer due to a requirement for a plurality of heat treatment processes. In this embodiment, the material and the thickness of each layer structure in the first doped region 20 and in the second doped region 30 are correspondingly designed according to actual use requirements, which are not specifically limited herein.

In addition, in a preferred embodiment of the disclosure, a hole density of the passivation layer in the P-type doped region is greater than a hole density of the passivation layer in the N-type doped region. The hole density means a quantity of holes per unit area. That is to say, in a same unit area, the passivation layer in the P-type doped region has more holes than the passivation layer in the N-type doped region. A main reason lies in that a conductivity of the P-type doped region is relatively poor, and the thickness of the passivation layer in the P type doped region is relatively large. Therefore, more holes are required to enhance the conductivity.

In an embodiment of the disclosure, the first dielectric layer 40 and the second dielectric layer 50 each are an aluminum oxide layer, a silicon nitride layer, a silicon oxynitride layer, a silicon carbide layer, an amorphous silicon layer, a silicon oxide layer, or a combination thereof. The first dielectric layer 40 and the second dielectric layer 50 achieve a passivation effect. The first dielectric layer 40 and the second dielectric layer 50 each are designed as a structure having at least one layer. Refractive indexes of the first dielectric layer and the second dielectric layer decrease from the silicon substrate 10 toward the outside, so that a film layer close to the silicon substrate 10 achieves the passivation effect, and a film layer away from the silicon substrate 10 achieves an antireflection effect, thereby enhancing the anti-reflection effect. In this way, the silicon substrate 10 absorbs and uses light more effectively, and the short-circuit current density is increased. Each film layer in the first dielectric layer 40 and in the second dielectric layer 50 that has a different structure comprises a plurality of films each having a specific refractive index. According to the above, the film layers are arranged such that the refractive indexes of the film layers decrease from the silicon substrate 10 toward the outside. For example, the silicon oxide layer in the first dielectric layer 40 comprises a plurality of silicon oxide films having refractive indexes decreasing from the silicon substrate 10 toward the outside.

It should be noted that, the first dielectric layer 40 and the second dielectric layer 50 may have a same structural arrangement or different structural arrangements. The film layer structures in the first dielectric layer 40 and in the second dielectric layer 50 may be correspondingly designed according to actual use requirements, which are not specifically limited herein. Preferably, the first dielectric layer 40 and the second dielectric layer 50 are designed same, so that the first dielectric layer 40 and the second dielectric layer 50 may be prepared on the front side and the back side of the silicon substrate 10 respectively by using a same process.

In a preferred embodiment of the disclosure, the first dielectric layer 40 and/or the second dielectric layer 50 include/includes a double-layer structure of an aluminum oxide layer and a silicon carbide layer or a double-layer structure of a silicon oxide layer and a silicon carbide layer. In this case, an entire thickness of the first dielectric layer 40 is greater than 50 nm, and an entire thickness of the second dielectric layer 50 is greater than 25 nm. It may be understood that, the specific structural arrangements of the first dielectric layer 40 and the second dielectric layer 50 include but are not limited to the specific examples listed above.

Further, in an embodiment of the disclosure, a thickness of the aluminum oxide layer or the silicon oxide layer in the first dielectric layer 40 is less than 40 nm. A thickness of the aluminum oxide layer or the silicon oxide layer in the second dielectric layer 50 is less than 25 nm. A thickness of the silicon carbide layer in the first dielectric layer 40 and/or in the second dielectric layer 50 is greater than 10 nm. The silicon carbide layer in the first dielectric layer 40 and/or in the second dielectric layer 50 can not only provide a hydrogen passivation effect, but also reduce parasitic light absorption by virtue of a large optical band gap and a small absorption coefficient.

It needs to be noted that, the multi-layer structure in this embodiment of the disclosure conforms to an arrangement sequence from the silicon substrate 10 toward the outside. For example, when the above first dielectric layer 40 includes the aluminum oxide layer and the silicon carbide layer, the aluminum oxide layer is close to the silicon substrate 10, and the silicon carbide layer is close to the outside. It needs to be further noted that, in the drawings, FIG. 2 to FIG. 8 only show the first dielectric layer 40 and the second dielectric layer 50 as double-layer structures. However, it may be understood that, the first dielectric layer 40 and the second dielectric layer 50 may also include other quantities of layers. Respective specific structures may be designed according to actual needs, and are not completely limited to the drawings. It needs to be further noted that, each drawing of the disclosure is merely used to describe the specific structural distribution in the solar cell, but does not correspond to an actual size of each structure. The drawings do not completely correspond to specific actual sizes in this embodiment, and the actual size of each structure needs to conform to specific parameters provided in this embodiment.

Further, the silicon carbide layer in the first dielectric layer 40 and/or in the second dielectric layer 50 comprises at least one silicon carbide film. The refractive indexes of the silicon carbide films decrease from the silicon substrate 10 toward the outside. Optionally, the refractive indexes of the above material may be generally selected as follows: the refractive index of monocrystalline silicon is 3.88, the refractive index of amorphous silicon is in a range of 3.5-4.2, the refractive index of polysilicon is 3.93, the refractive index of silicon carbide is in a range of 2-3.88, the refractive index of silicon nitride is in a range of 1.9-3.88, the refractive index of silicon oxynitride is in a range of 1.45-3.88, the refractive index of silicon oxide is 1.45, and the refractive index of aluminum oxide is 1.63. It may be understood that, the refractive indexes of the above materials may also be set to other values according to actual use requirements, which are not specifically limited herein.

Further, in an embodiment of the disclosure, a magnesium fluoride layer is further disposed outside the first dielectric layer 40 and/or the second dielectric layer 50. That is to say, in addition to one or a combination of more of the aluminum oxide layer, the silicon nitride layer, the silicon oxynitride layer, the silicon carbide layer, the amorphous silicon layer, and the silicon oxide layer selected for the first dielectric layer 40 and the second dielectric layer 50, a magnesium fluoride layer may be further disposed outside the first dielectric layer 40 and/or the second dielectric layer 50. The magnesium fluoride layer is required to have a lowest refractive index. Generally, the refractive index is set to 1.4. The magnesium fluoride layer has an optical effect of enhancing antireflection.

Further, in an embodiment of the disclosure, an electric field layer or a floating junction is disposed between the front side of the silicon substrate 10 and the first dielectric layer 40. Specifically, the electric field layer is prepared by means of phosphorus diffusion on the silicon substrate 10, or the floating junction is prepared by means of boron diffusion. The electric field layer or the floating junction is used as a front surface electric field of the solar cell.

In an embodiment of the disclosure, the first conductive layer 60 and/or the second conductive layer 70 are/is a TCO transparent conductive film and/or a metal electrode. The metal electrode includes a silver electrode, a copper electrode, an aluminum electrode, a tin-coated copper electrode, or a silver-coated copper electrode. Further, the copper electrode is electroplated copper prepared by using an electroplating process or the copper electrode prepared by means of physical vapor deposition. A nickel electrode, a chromium electrode, a titanium electrode, or a tungsten electrode is used as a seed layer or a protective layer of the electroplated copper. It needs to be noted that, the first conductive layer 60 and the second conductive layer 70 may select a same electrode or different electrodes. For example, the first conductive layer 60 and the second conductive layer 70 both select the aluminum electrode. Alternatively, the first conductive layer 60 selects the silver electrode, and the second conductive layer 70 selects the aluminum electrode.

Further, in an embodiment of the disclosure, a texturing process is further performed before the first dielectric layer 40 is prepared on the front side of the silicon substrate 10. A shape formed on the front side includes but is not limited to an alkali polished surface, a mechanically polished surface, a random pyramid shape, an inverted pyramid shape, a spherical cap shape, a V-shaped groove, and a shape ranging among the above shapes. The surface shape formed on the front side of the silicon substrate 10 helps reduce the reflection of sunlight on the front side, thereby improving the conversion efficiency of the solar cell.

Further, in an embodiment of the disclosure, the second dielectric layer 50 may cover only a region between the first doped region 20 and the second doped region 30 on the silicon substrate 10, or may extend to cover the first doped region 20 and/or the second doped region 30. When the second dielectric layer 50 covers only the region between the first doped region 20 and the second doped region 30 on the silicon substrate 10, the first conductive layer 60 covers an entire back side of the first doped region 20 for electric connection, and the second conductive layer 70 covers an entire back side of the second doped region 30 for electric connection. When the second dielectric layer 50 extends to cover the first doped region 20 and/or the second doped region 30, the first conductive layer 60 covers a back surface of a remaining part that not covered by the second dielectric layer 50 in the first doped region 20 for achieve electric connection, and the second conductive layer 70 covers a back surface of a remaining part not covered by the second dielectric layer 50 in the second doped region 30 for electric connection. When the second dielectric layer 50 covers the entire back side, the first conductive layer 60 penetrates the second dielectric layer 50 through perforations or the like to be electrically connected to the first doped region 20, and the second conductive layer 70 penetrates the second dielectric layer 50 through perforations or the like to be electrically connected to the second doped region 30. The conductive polarities of the first conductive layer 60 and the second conductive layer 70 are determined according to the polarities of the first doped region 20 and the second doped region 30, which are not specifically limited herein.

Figure 3:
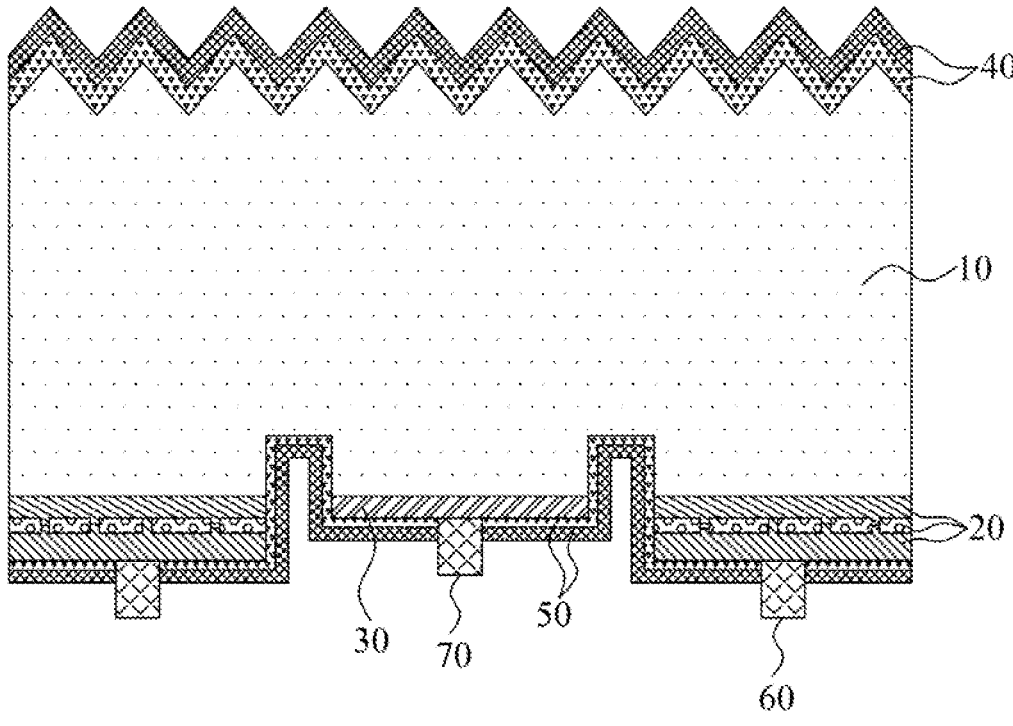

In an embodiment of the disclosure, referring to FIG. 2 and FIG. 3, the first doped region 20 and the second doped region 30 are alternately disposed on the back side of the silicon substrate 10. In order to avoid undesirable phenomena such as electric leakage caused by unobstructed connection between the first doped region 20 and the second doped region 30, a trench is provided between the first doped region 20 and the second doped region 30. The trench separates the first doped region 20 from the second doped region 30. Correspondingly, the second dielectric layer 50 covers the trench. It needs to be noted that, a surface shape of the trench that is in contact with the silicon substrate 10 may further have a rough texture structure disposed thereon. The rough texture structure is usually formed by means of texturing, and includes but is not limited to an alkali polished surface, a mechanically polished surface, a random pyramid shape, an inverted pyramid shape, a spherical cap shape, a V-shaped groove, and a shape ranging among the above shapes. An irregular hemispherical texture may be formed by means of acid texturing, a pyramid-shaped texture may be formed by means of alkali texturing, or the pyramid-shaped texture may be formed first by means of alkali texturing and then smoothing is performed on a top of a pyramid-shaped by means of acid texturing. In this way, the surface shape formed at the trench on the back side of the silicon substrate 10 helps the silicon substrate 10 absorb and reuse light more effectively, and the short-circuit current density is increased, thereby enhancing the conversion efficiency of the solar cell.

Figure 5:
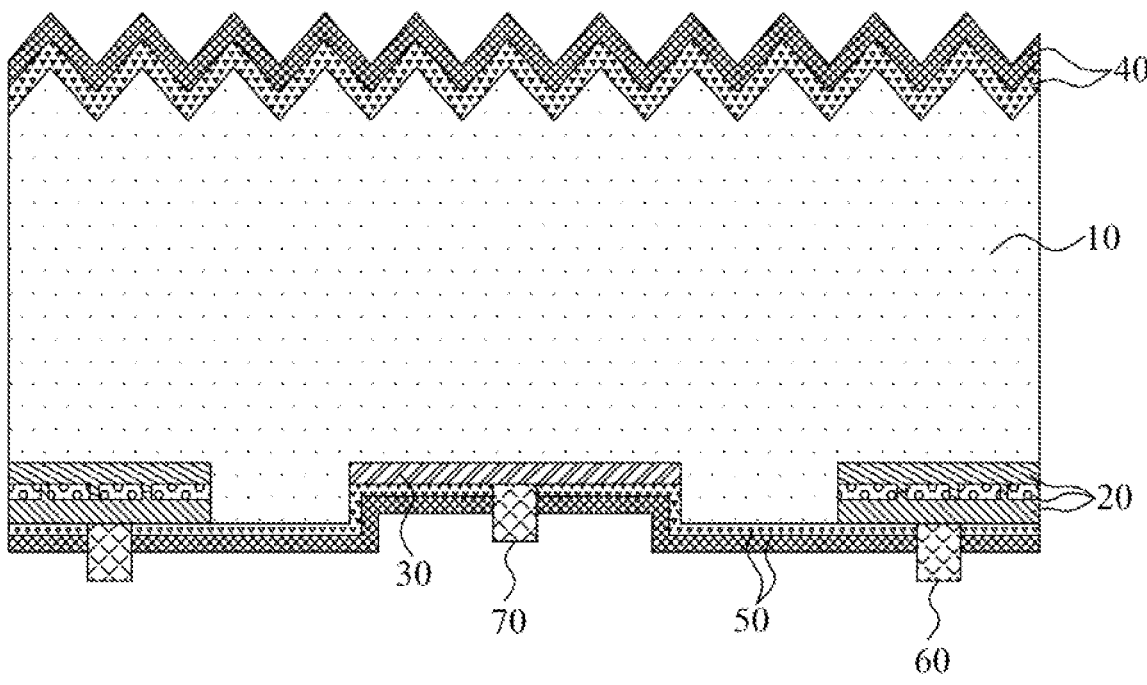

In another embodiment of the disclosure, referring to FIG. 4 and FIG. 5, grooves spaced apart are provided on the back side of the silicon substrate 10. The first doped region 20 and the second doped region 30 are alternately disposed in the grooves. The grooves may be formed by means of laser ablation or by using a combination of a mask (such as a hard mask, a silicon oxide mask, a silicon nitride mask, or a photoresist mask) and wet/dry etching. By means of the grooves spaced apart on the back side of the silicon substrate 10, a region between two adjacent grooves of the silicon substrate 10 is generally formed into a protrusion shape. Therefore, the blocking between the first doped region 20 and the second doped region 30 disposed in the grooves can be realized by the protrusion structure between the grooves of the silicon substrate 10. Optionally, a trench may be further disposed between the first doped region 20 and the second doped region 30. In this case, a trench may be provided in the protrusion structure or the groove, so that double isolation between the first doped region 20 and the second doped region 30 can be realized by the protrusion structure between the grooves of the silicon substrate 10 and the trench structure.

The first doped region 20 and the second doped region 30 include at least the doped region structure described in the above embodiments. It needs to be noted that, the passivation layer in the doped region structure may cover only a bottom wall of the grooves, or may extend to cover sidewalls of the groove. Preferably, the passivation layer covers the bottom wall and the sidewalls of the groove. In this case, the first doped layer is correspondingly disposed on the bottom wall and the sidewalls of the groove. Therefore, carriers generated on the silicon substrate 10 are easily separated by using the passivation layer on the sidewalls of the groove and selectively collected in the corresponding second doped layer. In this way, multidimensional collection of the carriers in the bottom wall and the sidewalls of the groove can be realized. It needs to be noted that, the first doped region 20 and the second doped region 30 may be respectively disposed in partial regions in the corresponding grooves.

Further, in an embodiment of the disclosure, the groove is in a circular arc shape, a trapezoidal shape, or a square shape. The groove is preferably designed as the circular arc shape or the trapezoidal shape. When the groove is designed as the circular arc shape or the trapezoidal shape, inner walls of the groove can reflect light more desirably, and a surface area of the passivation layer of the doped region structure that is contact with the first doped layer can be further increased. Definitely, when the groove is designed as the square shape, an actual production process is much simpler. It needs to be further noted that, the grooves may have a same shape or different shapes. For example, the groove of the first doped region 20 and the groove of the second doped region 30 are designed as the square shape, or the groove of the first doped region 20 is designed as the square shape, and the groove of the second doped region 30 is designed as the circular arc shape, or the like. Thus, the shapes of the grooves may be designed according to actual use requirements, which are not specifically limited herein. Further, a width and a depth of each groove may be designed same or differently, and may be designed according to actual use requirements, which are not specifically limited herein.

Further, in an embodiment of the disclosure, a total thickness of the first doped region 20 and/or a total thickness of the second doped region 30 may be greater than, less than, or equal to the depth of the groove. When the total thickness of the first doped region 20 and/or the total thickness of the second doped region 30 are/is less than or equal to the depth of the groove, the first doped region 20 and/or the second doped region 30 do/does not extend out of the groove. Therefore, the blocking of the first doped region 20 and/or the second doped region 30 is realized directly by the protrusion structure between the grooves. When the total thickness of the first doped region 20 and/or the total thickness of the second doped region 30 are/is greater than the depth of the groove, the first doped region 20 and/or the second doped region 30 may extend to protrusion regions among the grooves. That is to say, for example, the first doped region 20 may extend to a partial or entire region between the grooves, but does not come into contact with the adjacent second doped region 30.

Further, in an embodiment of the disclosure, the back side of the silicon substrate 10 in the protrusion regions among the grooves has a rough texture structure. The rough texture structure is usually formed by means of texturing, and includes but is not limited to an alkali polished surface, a mechanically polished surface, a random pyramid shape, an inverted pyramid shape, a spherical cap shape, a V-shaped groove, and a shape ranging among the above shapes. An irregular hemispherical texture may be formed by means of acid texturing, a pyramid-shaped texture may be formed by means of alkali texturing, or the pyramid-shaped texture may be formed first by means of alkali texturing and then smoothing is performed on a top of a pyramid-shaped by means of acid texturing. It may be understood that, the rough texture structure may also be arranged on the entire back side of the silicon substrate 10.

Figure 7:
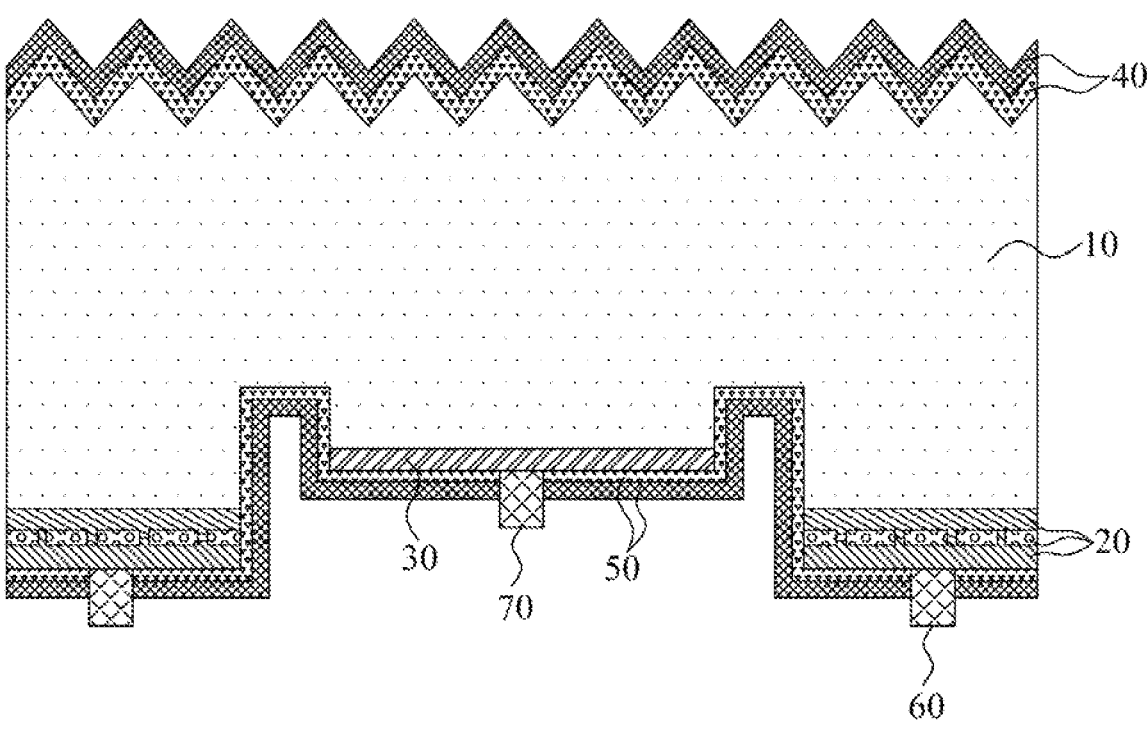
Figure 8:
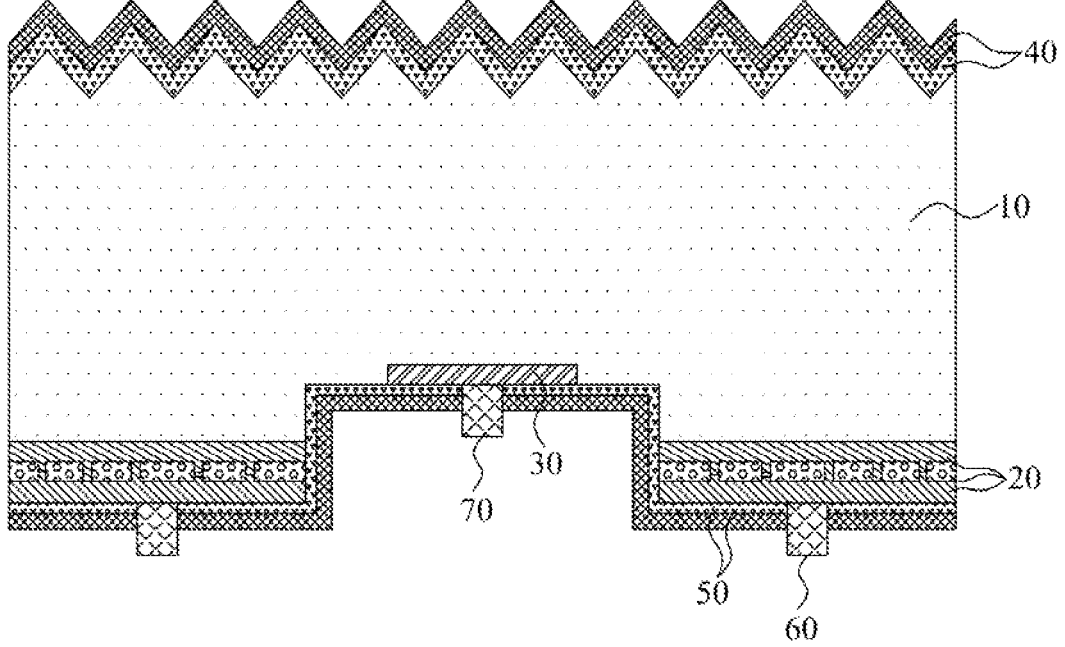

In still another embodiment of the disclosure, referring to FIG. 6, FIG. 7, and FIG. 8, grooves spaced apart are provided on the back side of the silicon substrate 10. One of the first doped region 20 and the second doped region 30 is disposed in one of the grooves, and the other of the first doped region and the second doped region is disposed outside the groove. In order to realize the blocking between the first doped region 20 and the second doped region 30, a trench may be further provided between the first doped region 20 and the second doped region 30. The first doped region 20 is separated from the second doped region 30 by the trench, as shown in FIG. 6 and FIG. 7. The first doped region 20 and the second doped region 30 may also be disposed in partial regions inside and outside the groove, so that the silicon substrate 10 inside and outside the groove that is not covered by the first doped region 20 and the second doped region 30 realizes the separation of the first doped region 20 from the second doped region 30, as shown in FIG. 8. Definitely, the non-contact between the first doped region 20 and the second doped region 30 may also be realized by setting the depth of the groove. For other specific descriptions of the groove and the first doped region 20 and the second doped region 30 disposed inside and outside the groove, refer to the above descriptions, and details are not described herein again.

Therefore, in an embodiment of the disclosure, the first doped region 20 and the second doped region 30 both may be disposed on the back side of the silicon substrate 10, or both may be disposed on the grooves spaced apart on the silicon substrate 10, or may be respectively disposed inside and outside the grooves spaced on the silicon substrate 10. The first doped region 20 and the second doped region 30 include at least the doped region structure described in the above embodiments, and include a diffusion structure comprising the third doped layer or a passivated contact structure comprising the tunneling layer and the doped region. Thus, the prepared solar cell may be as follows.

Cell I: The first doped region 20 and the second doped region 30 are both disposed on the back side of the silicon substrate 10. The first doped region 20 and the second doped region 30 have the doped region structure described in the above embodiments. A trench is provided between the first doped region 20 and the second doped region 30.

Cell II: The first doped region 20 and the second doped region 30 are both disposed on the back side of the silicon substrate 10. One of the first doped region 20 and the second doped region 30 has the doped region structure described in the above embodiments, and the other of the first doped region and the second doped region has the diffusion structure comprising the third doped layer. A trench is provided between the first doped region 20 and the second doped region 30.

Cell III: The first doped region 20 and the second doped region 30 are both disposed on the back side of the silicon substrate 10. One of the first doped region 20 and the second doped region 30 has the doped region structure described in the above embodiments, and the other of the first doped region and the second doped region has the passivated contact structure comprising the tunneling layer and the doped region. A trench is provided between the first doped region 20 and the second doped region 30.

Cell IV: The first doped region 20 and the second doped region 30 are alternately disposed in the grooves of the silicon substrate 10. The first doped region 20 and the second doped region 30 both have the doped region structure described in the above embodiments.

Cell V: The first doped region 20 and the second doped region 30 are alternately disposed in the grooves of the silicon substrate 10. One of the first doped region 20 and the second doped region 30 has the doped region structure described in the above embodiments, and the other of the first doped region and the second doped region has the diffusion structure comprising the third doped layer.

Cell VI: The first doped region 20 and the second doped region 30 are alternately disposed in the grooves of the silicon substrate 10. One of the first doped region 20 and the second doped region 30 has the doped region structure described in the above embodiments, and the other of the first doped region and the second doped region has the passivated contact structure comprising the tunneling layer and the doped region.

Cell VII: The first doped region 20 is disposed in the groove, and the second doped region 30 is disposed on the protrusion. The first doped region 20 and the second doped region 30 both have the doped region structure described in the above embodiments. A trench may be provided between the first doped region 20 and the second doped region 30.

Cell VIII: One of the first doped region 20 and the second doped region 30 has the doped region structure described in the above embodiments, and the other of the first doped region and the second doped region has the diffusion structure comprising the third doped layer. The doped region structure is disposed on the protrusion, and the diffusion structure is disposed in the groove. A trench may be provided between the first doped region 20 and the second doped region 30.

Cell IX: One of the first doped region 20 and the second doped region 30 has the doped region structure described in the above embodiments, and the other of the first doped region and the second doped region has the diffusion structure comprising the third doped layer. The doped region structure is disposed in the groove, and the diffusion structure is disposed on the protrusion. A trench may be provided between the first doped region 20 and the second doped region 30.

Cell X: One of the first doped region 20 and the second doped region 30 has the doped region structure described in the above embodiments, and the other of the first doped region and the second doped region has the passivated contact structure comprising the tunneling layer and the doped region. The doped region structure is disposed on the protrusion, and the passivated contact structure is disposed in the groove. A trench may be provided between the first doped region 20 and the second doped region 30.

Cell XI: One of the first doped region 20 and the second doped region 30 has the doped region structure described in the above embodiments, and the other of the first doped region and the second doped region has the passivated contact structure comprising the tunneling layer and the doped region. The doped region structure is disposed in the groove, and the passivated contact structure is disposed on the protrusion. A trench may be provided between the first doped region 20 and the second doped region 30.

Different from the passivated contact structure in the prior art, in this embodiment, the doped region structure is disposed, the passivation layer in the doped region structure is arranged as a porous structure, and the hole region has the first doped layer and/or the second doped layer. Therefore, a conductive channel is formed in the hole region of the passivation layer, so that a desirable resistivity of the passivation layer is formed. In this way, a thickness of the passivation layer has a less impact on the resistance, and the control requirements for the thickness of the passivation layer are lowered. Thus, more methods are applicable to preparation of the passivation layer compared with the prior art. The first doped layer is disposed between the silicon substrate and the passivation layer to form a separation electric field capable of enhancing surface electron holes, so that the field passivation effect is enhanced. Since a Fermi level of the first doped layer is different from a Fermi level of the silicon substrate, the Fermi level of the first doped layer is changed. A solid concentration of impurities (transition metals) is increased, so that an additional impurity gettering effect is formed. In addition, in the porous structure, the second doped layer is connected to the silicon substrate through the doped hole region and the first doped layer, so that the overall resistance of the prepared cell is further reduced, and the conversion efficiency of the cell is improved. In this way, the difficulty in production and the limitation on the conversion efficiency as a result of precise requirements for the thickness of the conventional tunneling layer are resolved.

Example 3

Figure 9:
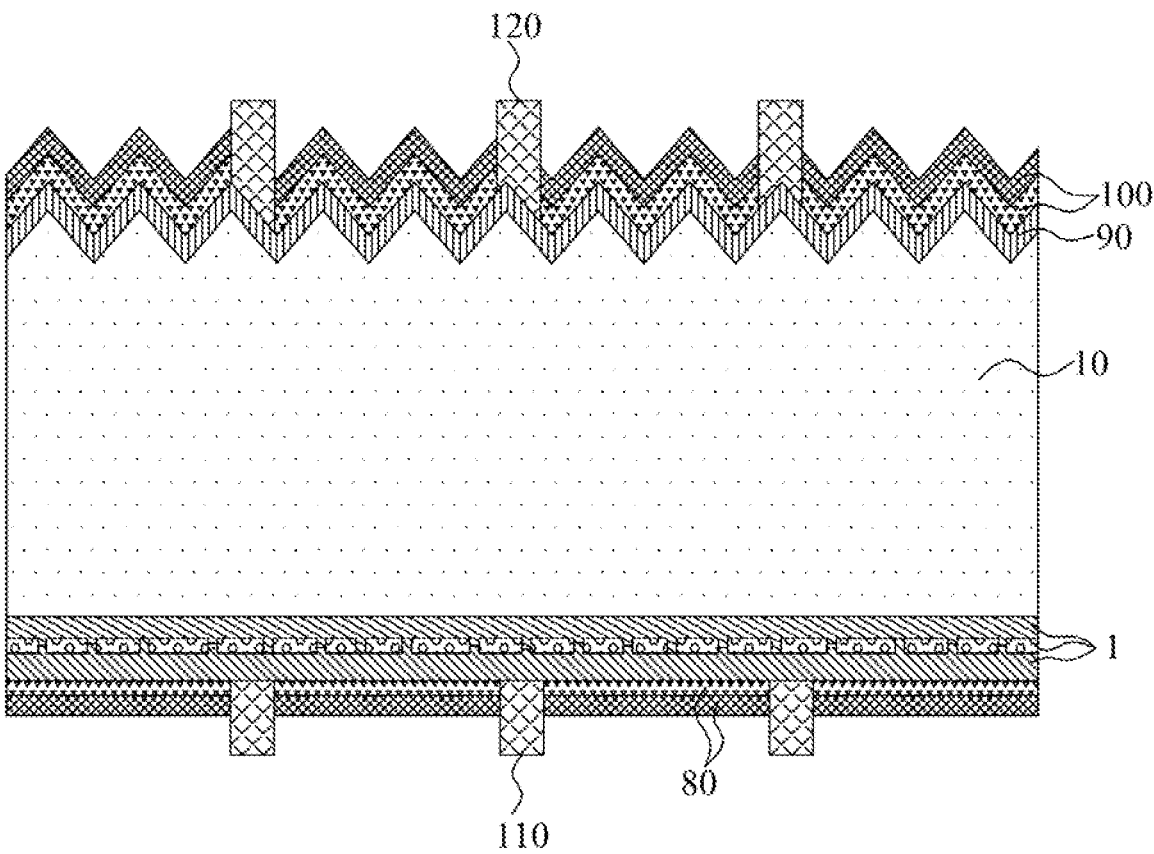
FIG. 9 is a schematic structural diagram of a solar cell according to another embodiment of the disclosure.

A third embodiment of the disclosure provides a solar cell. For ease of description, only parts related to this embodiment of the disclosure are shown. Referring to FIG. 9, the solar cell provided in this embodiment of the disclosure includes:

a silicon substrate 10;

the doped region structure 1 described in the above embodiments, disposed on a back side of the silicon substrate 10;

a third dielectric layer 80, disposed on the doped region structure 1;

a fourth doped layer 90 and a fourth dielectric layer 100, disposed on a front side of the silicon substrate 10 in sequence; and a third conductive layer 110 and a fourth conductive layer 120, respectively electrically connected to the doped region structure 1 and the fourth doped layer 90.

The doped region structure 1 and the fourth doped layer 90 have opposite polarities.

The fourth doped layer 90 is a monocrystalline silicon doped layer doped with a group-III or group-V element. For details of the fourth doped layer, refer to the description of the first doped layer in the doped region structure 1 in the above embodiments. It needs to be further noted that, since the doped region structure 1 and the fourth doped layer 90 have opposite polarities, the first doped layer and the fourth doped layer 90 are respectively doped with an element of a different group. That is to say, when the first doped layer is doped with a group-III element, the fourth doped layer 90 is doped with a group-V element. When the first doped layer is doped with a group-V element, the fourth doped layer 90 is doped with a group-III element.

In an embodiment of the disclosure, the third dielectric layer 80 and the fourth dielectric layer 100 each are an aluminum oxide layer, a silicon nitride layer, a silicon oxynitride layer, a silicon carbide layer, an amorphous silicon layer, a silicon oxide layer, or a combination thereof. The third dielectric layer 80 and the fourth dielectric layer 100 achieve a passivation effect. The third dielectric layer 80 and the fourth dielectric layer 100 each are designed as a structure having at least one layer. Refractive indexes of the third dielectric layer and the fourth dielectric layer decrease from the silicon substrate 10 toward the outside, so that a film layer close to the silicon substrate 10 achieves the passivation effect, and a film layer away from the silicon substrate 10 achieves an antireflection effect, thereby enhancing the anti-reflection effect. In this way, the silicon substrate 10 absorbs and uses light more effectively, and the short-circuit current density is increased. Each film layer in the third dielectric layer 80 and in the fourth dielectric layer 100 that has a different structure comprises a plurality of films each having a specific refractive index. According to the above, the film layers are arranged such that the refractive indexes of the film layers decrease from the silicon substrate 10 toward the outside. For example, the silicon oxide layer in the third dielectric layer 80 comprises a plurality of silicon oxide films having refractive indexes decreasing from the silicon substrate 10 toward the outside.

It should be noted that, the third dielectric layer 80 and the fourth dielectric layer 100 may have a same structural arrangement or different structural arrangements. The film layer structures in the third dielectric layer 80 and the fourth dielectric layer 100 may be correspondingly designed according to actual use requirements, which are not specifically limited herein. Preferably, the third dielectric layer 80 and the fourth dielectric layer 100 are designed same, so that the fourth dielectric layer 100 and the third dielectric layer 80 may be prepared on the front side and the back side of the silicon substrate 10 respectively by using a same process.

In a preferred embodiment of the disclosure, the third dielectric layer 80 and/or the fourth dielectric layer 100 include/includes a double-layer structure of an aluminum oxide layer and a silicon carbide layer or a double-layer structure of a silicon oxide layer and a silicon carbide layer. An entire thickness of the third dielectric layer 80 is greater than 25 nm, and an entire thickness of the fourth dielectric layer 100 is greater than 50 nm. It may be understood that, the specific structural arrangements of the third dielectric layer 80 and the fourth dielectric layer 100 include but are not limited to the specific examples listed above.

Further, in an embodiment of the disclosure, a thickness of the aluminum oxide layer or the silicon oxide layer in the third dielectric layer 80 is less than 25 nm. A thickness of the aluminum oxide layer or the silicon oxide layer in the fourth dielectric layer 100 is less than 40 nm. A thickness of the silicon carbide layer in the third dielectric layer 80 and/or in the fourth dielectric layer 100 is greater than 10 nm. The silicon carbide layer in the third dielectric layer 80 and/or in the fourth dielectric layer 100 can not only provide a hydrogen passivation effect, but also reduce parasitic light absorption by virtue of a large optical band gap and a small absorption coefficient.

It needs to be noted that, the multi-layer structure in this embodiment of the disclosure conforms to an arrangement sequence from the silicon substrate 10 toward the outside. For example, when the above third dielectric layer 80 includes the aluminum oxide layer and the silicon carbide layer, the aluminum oxide layer is close to the silicon substrate 10, and the silicon carbide layer is close to the outside. It needs to be further noted that, in the drawings, FIG. 9 only shows the third dielectric layer 80 and the fourth dielectric layer 100 as double-layer structures. However, it may be understood that, the third dielectric layer 80 and the fourth dielectric layer 100 may also include other quantities of layers. Respective specific structures may be designed according to actual needs, and are not completely limited to the drawings. It needs to be further noted that, each drawing of the disclosure is merely used to describe the specific structural distribution in the solar cell, but does not correspond to an actual size of each structure. The drawings do not completely correspond to specific actual sizes in this embodiment, and the actual size of each structure needs to conform to specific parameters provided in this embodiment.

Further, the silicon carbide layer in the third dielectric layer 80 and/or in the fourth dielectric layer 100 comprises at least one silicon carbide film. The refractive indexes of the silicon carbide films decrease from the silicon substrate 10 toward the outside. Optionally, the refractive indexes of the above material may be generally selected as follows: the refractive index of monocrystalline silicon is 3.88, the refractive index of amorphous silicon is in a range of 3.5-4.2, the refractive index of polysilicon is 3.93, the refractive index of silicon carbide is in a range of 2-3.88, the refractive index of silicon nitride is in a range of 1.9-3.88, the refractive index of silicon oxynitride is in a range of 1.45-3.88, the refractive index of silicon oxide is 1.45, and the refractive index of aluminum oxide is 1.63. It may be understood that, the refractive indexes of the above materials may also be set to other values according to actual use requirements, which are not specifically limited herein.

Further, in an embodiment of the disclosure, a magnesium fluoride layer is further disposed outside the third dielectric layer 80 and/or the fourth dielectric layer 100. That is to say, in addition to one or a combination of more of the aluminum oxide layer, the silicon nitride layer, the silicon oxynitride layer, the silicon carbide layer, the amorphous silicon layer, and the silicon oxide layer selected for the third dielectric layer 80 and the fourth dielectric layer 100, a magnesium fluoride layer may be further disposed outside the third dielectric layer 80 and/or the fourth dielectric layer 100. The magnesium fluoride layer is required to have a lowest refractive index. Generally, the refractive index is set to 1.4. The magnesium fluoride layer has an optical effect of enhancing antireflection.

In an embodiment of the disclosure, the third conductive layer 110 and/or the fourth conductive layer 120 are/is a TCO transparent conductive film and/or a metal electrode. The metal electrode includes a silver electrode, a copper electrode, an aluminum electrode, a tin-coated copper electrode, or a silver-coated copper electrode. Further, the copper electrode is electroplated copper prepared by using an electroplating process or the copper electrode prepared by means of physical vapor deposition. A nickel electrode, a chromium electrode, a titanium electrode, or a tungsten electrode is used as a seed layer or a protective layer of the electroplated copper. It needs to be noted that, the third conductive layer 110 and the fourth conductive layer 120 may select a same material or different materials. For example, the third conductive layer 110 and the fourth conductive layer 120 both select the aluminum electrode, or the third conductive layer 110 selects the silver electrode, and the fourth conductive layer 120 selects the aluminum electrode. Further, the third conductive layer 110 penetrates the third dielectric layer 80 through perforations or the like to be electrically connected to the doped region structure 1. The fourth conductive layer 120 penetrates the fourth dielectric layer 100 through perforations or the like to be electrically connected to the fourth doped layer 90. The conductive polarities of the third conductive layer 110 and the fourth conductive layer 120 are determined according to the polarities of the doped region structure 1 and the fourth doped layer 90, which are not specifically limited herein.

Further, in an embodiment of the disclosure, a texturing process is further performed before the fourth dielectric layer 100 is prepared on the front side of the silicon substrate 10. A shape formed on the front side is not limited to an alkali polished surface, a mechanically polished surface, a random pyramid shape, an inverted pyramid shape, a spherical cap shape, a V-shaped groove, and a shape ranging among the above shapes. The surface shape formed on the front side of the silicon substrate 10 helps reduce the reflection of sunlight on the front side, thereby improving the conversion efficiency of the solar cell.

Different from the passivated contact structure in the prior art, in this embodiment, the doped region structure is disposed, the passivation layer in the doped region structure is arranged as a porous structure, and the hole region has the first doped layer and/or the second doped layer. Therefore, a conductive channel is formed in the hole region of the passivation layer, so that a desirable resistivity of the passivation layer is formed. In this way, a thickness of the passivation layer has a less impact on the resistance, and the control requirements for the thickness of the passivation layer are lowered. Thus, more methods are applicable to preparation of the passivation layer compared with the prior art. The first doped layer is disposed between the silicon substrate and the passivation layer to form a separation electric field capable of enhancing surface electron holes, so that the field passivation effect is enhanced. Since a Fermi level of the first doped layer is different from a Fermi level of the silicon substrate, the Fermi level of the first doped layer is changed. A solid concentration of impurities (transition metals) is increased, so that an additional impurity gettering effect is formed. In addition, in the porous structure, the second doped layer is connected to the silicon substrate through the doped hole region and the first doped layer, so that the overall resistance of the prepared cell is further reduced, and the conversion efficiency of the cell is improved. In this way, the difficulty in production and the limitation on the conversion efficiency as a result of precise requirements for the thickness of the conventional tunneling layer are resolved.

Example 4

A fourth embodiment of the disclosure further provides a cell assembly. The cell assembly includes the solar cell described in Example 2.

Example 5

A fifth embodiment of the disclosure further provides a photovoltaic system. The photovoltaic system includes the cell assembly described in Example 4.

Example 6

A sixth embodiment of the disclosure further provides a cell assembly. The cell assembly includes the solar cell described in Example 3.

Example 7

A seventh embodiment of the disclosure further provides a photovoltaic system. The photovoltaic system includes the cell assembly described in Example 6.

It will be obvious to those skilled in the art that changes and modifications may be made, and therefore, the aim in the appended claims is to cover all such changes and modifications.

The invention claimed is:

1. A solar cell, comprising:

a silicon substrate;

a doped region structure disposed on a back side of the silicon substrate, the doped region structure comprising a first doped layer, a passivation layer, and a second doped layer that are disposed on the silicon substrate in sequence;

a first dielectric layer, disposed on the doped region structure;

a third doped layer and a second dielectric layer, disposed on a front side of the silicon substrate in sequence; and a first conductive layer and a second conductive layer, respectively electrically connected to the doped region structure and the third doped layer;

wherein:

the doped region structure and the third doped layer have opposite polarities;

the passivation layer includes a plurality of porous structures and plurality of hole regions interposing with each other, a hole region of the plurality of hole regions includes a through hole extending through the passivation layer, a porous structure of the plurality of porous structures includes an opening at a surface of the passivation layer, the first doped layer and/or the second doped layer are disposed in the hole region, and a conductive channel is formed in the hole region of the passivation layer and connects the first doped layer and the second doped layer; and the second doped layer is connected to the silicon substrate through the doped hole region and the first doped layer, wherein the second doped layer comprises a polysilicon doped layer, a silicon carbide doped layer, or an amorphous silicon doped layer; and when the second doped layer is the silicon carbide doped layer, the silicon carbide doped layer comprises multiple silicon carbide doped films, and refractive indexes of the multiple silicon carbide doped films decrease in a direction from the silicon substrate to an exterior of the solar cell.

2. The solar cell of claim 1, wherein the first doped layer and the second doped layer have a same doping polarity.

3. The solar cell of claim 1, wherein a pore size of the plurality of porous structures is less than 20 μm; and the plurality of porous structures are prepared by thermal diffusion impact.

4. The solar cell of claim 1, wherein a non-hole region of the plurality of porous structures comprises a dopant having a same doping type as the first doped layer and/or the second doped layer.

5. The solar cell of claim 1, wherein a part of the plurality of hole regions comprises the first doped layer and/or the second doped layer.

6. The solar cell of claim 1, wherein a ratio of an area of the plurality of hole regions to an entire area of the passivation layer is less than 20%, and holes of the passivation layer are sparsely distributed on the passivation layer.

7. The solar cell of claim 1, wherein a thickness of the passivation layer is in a range of 0.5-10 nm.

8. The solar cell of claim 7, wherein the thickness of the passivation layer is in a range of 0.8-2 nm.

9. The solar cell of claim 1, wherein the passivation layer is an oxide layer, a silicon carbide layer, an amorphous silicon layer, or a combination thereof.

10. The solar cell of claim 9, wherein the oxide layer comprises a silicon oxide layer, an aluminum oxide layer, or a combination thereof.

11. The solar cell of claim 1, wherein a doping concentration of the first doped layer is between a doping concentration of the silicon substrate and a doping concentration of the second doped layer.

12. The solar cell of claim 1, wherein the first doped layer is a monocrystalline silicon doped layer doped with a group-III or group-V element; and the first doped layer is completely continuously disposed between the silicon substrate and the passivation layer.

13. The solar cell of claim 1, wherein the silicon carbide doped layer in the second doped layer comprises a hydrogenated silicon carbide doped layer; a conductivity of the hydrogenated silicon carbide doped layer is greater than 0.01 S·cm, and a thickness of the hydrogenated silicon carbide doped layer is greater than 10 nm.

14. A photovoltaic system, comprising:
a solar cell, comprising:
a silicon substrate;
a doped region structure disposed on a back side of the silicon substrate, the doped region structure comprising a first doped layer, a passivation layer, and a second doped layer that are disposed on the silicon substrate in sequence;
a first dielectric layer, disposed on the doped region structure;
a third doped layer and a second dielectric layer, disposed on a front side of the silicon substrate in sequence; and
a first conductive layer and a second conductive layer, respectively electrically connected to the doped region structure and the third doped layer;
wherein:
the doped region structure and the third doped layer have opposite polarities;
the passivation layer includes a plurality of porous structures and a plurality of hole regions interposing with each other, a hole region of the plurality of hole regions includes a through hole extending through the passivation layer, a porous structure of the plurality of porous structures includes an opening at a surface of the passivation layer, the first doped layer and/or the second doped layer are disposed in the hole region, and a conductive channel is formed in the hole region of the passivation layer and connects the first doped layer and the second doped layer; and
the second doped layer is connected to the silicon substrate through the doped hole region and the first doped layer.

15. The solar cell of claim 1, wherein the first dielectric layer and the second dielectric layer each comprise multiple layers, and refractive indexes of the multiple layers in the first dielectric layer and the second dielectric layer decrease in the direction from the silicon substrate to the exterior of the solar cell.

16. The photovoltaic system of claim 14, wherein the second doped layer comprises a polysilicon doped layer, a silicon carbide doped layer, or an amorphous silicon doped layer.

17. The photovoltaic system of claim 16, wherein the silicon carbide doped layer in the second doped layer comprises at least one silicon carbide doped film; and refractive indexes of different silicon carbide doped films decrease from the silicon substrate toward outside.

18. A solar cell, comprising:
a silicon substrate;
a doped region structure disposed on a back side of the silicon substrate, the doped region structure comprising a first doped layer, a passivation layer, and a second doped layer that are disposed on the silicon substrate in sequence;
a first dielectric layer, disposed on the doped region structure;
a third doped layer and a second dielectric layer, disposed on a front side of the silicon substrate in sequence; and
a first conductive layer and a second conductive layer, respectively electrically connected to the doped region structure and the third doped layer;
wherein:
the doped region structure and the third doped layer have opposite polarities;
the passivation layer is a porous structure comprising a hole region, and the first doped layer and/or the second doped layer are disposed in the hole region, and a conductive channel is formed in the hole region of the passivation layer and connects the first doped layer and the second doped layer; and
the second doped layer is connected to the silicon substrate through the doped hole region and the first doped layer, wherein the second doped layer comprises a silicon carbide doped layer, the silicon carbide doped layer comprising multiple silicon carbide doped films, and refractive indexes of the multiple silicon carbide doped films decrease in a direction from the silicon substrate to an exterior of the solar cell.

* * * * *